United States Patent [19]

Miller

[11] 4,003,008

[45] Jan. 11, 1977

[54] ELECTROMAGNETIC SIGNAL PROCESSOR

[75] Inventor: Gabriel Lorimer Miller, Westfield, N.J.

[73] Assignee: Bell Telephone Laboratories, Incorporated, Murray Hill, N.J.

[22] Filed: May 14, 1975

[21] Appl. No.: 577,289

[52] U.S. Cl. .............................. 333/70 T; 333/70 S
[51] Int. Cl.² ...................... H03H 9/26; H03H 9/32
[58] Field of Search ................. 333/70 S, 70 T, 18, 333/28 R; 328/167

[56] References Cited

UNITED STATES PATENTS

| | | | |
|---|---|---|---|
| 2,942,195 | 6/1960 | Dean | 330/70 T |
| 3,177,433 | 4/1965 | Simon et al. | 330/70 T |
| 3,660,785 | 5/1972 | Hosokawa | 333/28 R |

OTHER PUBLICATIONS

Kuleshov, Yu. G." A Comb Filter Byulleten" 12 obreteniy, 1959, Nr. 3, p. 22 (USSR).

*Primary Examiner*—Alfred E. Smith
*Assistant Examiner*—David K. Moore
*Attorney, Agent, or Firm*—Allen N. Friedman

[57] ABSTRACT

An electromagnetic signal processor intended, for use, primarily, in the hundred kilohertz to the several hundred megahertz range includes a filtering or wave shaping first stage. The filtering stage (or filter, if constructed as a separate unit) includes a length of lumped or continuous electromagnetic transmission line with all or a portion of the shunt capacitance, at each point along the line, being connected to a low input impedance summing device. The longitudinal distribution of capacitance, thus connected, determines the frequency response of the processor. Particularly simple realizations involving transmission lines with split ground planes and operational integrators are disclosed. Use in communications systems and nuclear instrumentation is discussed.

11 Claims, 7 Drawing Figures

ELECTROMAGNETIC SIGNAL PROCESSOR

BACKGROUND OF THE INVENTION

1. Field of the Invention

The invention is in the field of filtering and frequency shaping electromagnetic signal processing devices.

2. Brief Description of the Prior Art

Filters of a class known as transversal filters include a length of transmission line each with a series of high impedance taps to extract signal information from the line without inordinate disturbance of the transmission path. The signal from each tap is individually adjusted (attenuated or amplified) such that, when brought together in a summing amplifier, this composite processor possesses the desired frequency response between the input to the transmission line and the output of the amplifier. (N. Weiner et al, U.S. Pat. No. 2,024,900, issued Dec. 17, 1935; H. E. Kallman, *Proceedings of the IRE*, 28 (1940)302). These signal processors and processing filters are extremely flexible in use and many can be automatically adjusted with electronically variable amplifiers in the taps. Such devices are extensively used, for example, in communications systems (H. Rudin, Jr. *IEEE Spectrum* (January 1967)53). These processors are particularly well suited for communications uses involving transmission paths (e.g., radio links) with time varying distortions and transmission paths (e.g., coaxial cables) which require processor adjustment in the field. Such processors tend to be relatively complex and expensive but are well worth the cost in situations where their extreme flexibility and adaptiveness is necessary.

SUMMARY OF THE INVENTION

An electromagnetic signal processor has been developed which is capable of simply and inexpensively providing a broad range of signal path frequency characteristics. It is particularly adaptable for use in time invariant situations, although time varying and adjustable relizations of these processors are possible at the expense of increased complexity. The subject processors include a length of lumped or continuous transmission line, into which the signal to be processed is introduced. Signal is extracted along the line via portions of the line shunt capacitance. The signal is collected and fed into a summing device with an input impedance which is low compared to the characteristic impedance of the transmission line. Simple realizations of these processors include transmission lines with ground planes, split to provide the varying capacitive signal extraction, and operational integrators to provide the low impedance summing. Such signal processors are suggested for use, for example, to process the detected signals in optical communications systems and elementary particle detector systems.

DETAILED DESCRIPTION OF THE INVENTION

Figure 2:
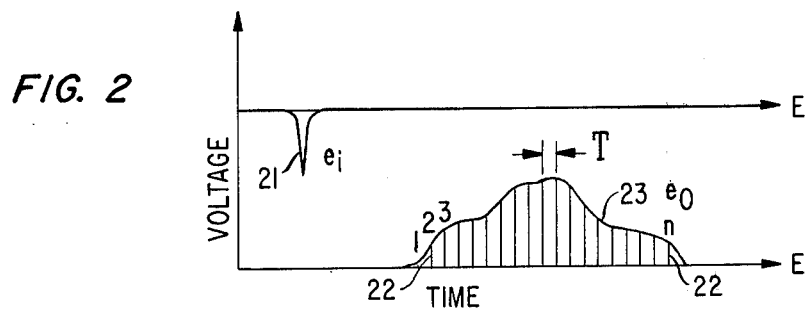
FIG. 2 is a plot of voltage as a function of time showing the output of a filter of FIG. 1 in response to a (negative going) input impulse.

The herein disclosed signal processors bear several conceptual similarities to transversal filters. The essence of the flexibility and ease of design of transversal filters resides in the recognition of the fact that the frequency response of any linear network is related by a Fourier transformation to its impulse response. Thus if the desired frequency response of a filter is known the desired impulse response can be calculated. A transversal filter consists of a length of a transmission line possessing a series of high impedance taps at which signal information can be extracted from the line. The signal from each tap passes through a separate amplitude controlling device, such as an attenuator or amplifier, so that the amplitude of each tapped signal can be individually adjusted relative to the amplitude of all of the other tapped signals. All of the adjusted tapped signals are then brought together into a common summing device. The design of a transversal filter with a desired impulse response is almost intuitively obvious considering the following argument. If a voltage impulse 21 (see FIG. 2) is launched into the transmission line, an equal signal is tapped off as the voltage pulse passes each tap. The amplitude of each of these tapped pulses is adjusted and the common summing point sees a series of pulses 22 (see FIG. 2) defining the desired impulse characteristic 23. The required pulse spacing bears a well known relation to the desired frequency resolution of the filter characteristic (W. D. Squire et al, *IEEE Transactions on Microwave Theory and Technique*, MTT-17, (1969)1020). The requirement that the taps be high impedance taps (i.e., much higher than the characteristic of the impedance of the transmission line) is due to the requirement that the taps not disturb the transmission path by producing inordinately large reflections.

Figure 1:
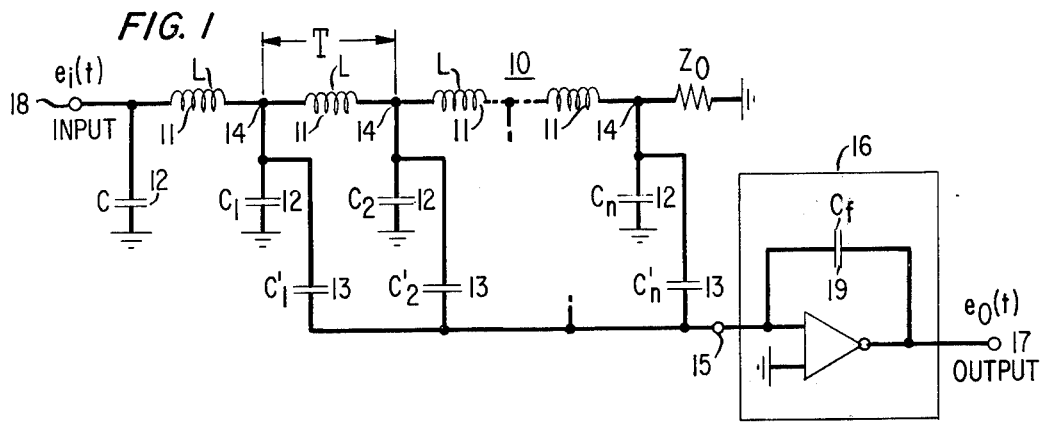
FIG. 1 is a schematic view of an exemplary signal processor of the invention including a length of lumped delay line.

The operation of the herein disclosed processors can be understood in similar terms. Further, in their lumped delay line realization, (see FIG. 1) they resemble transversal filters. In FIG. 1 the transmission line consists of a set of serially connected inductors 11, of inductance L and an array of capacitors 12, 13. The characteristic impedance of such a transmission line is determined by the inductance of each inductor 11 and the total capacitance connected to each junction point 14 according to the formula $Z = \sqrt{L/C}$. The total capacitance connected to each junction point 14 is split between, for example, two sets of capacitors shown in FIG. 1 as $C_i$ 12 and $C_i'$ 13 such that $C_i + C_i' = C$. The unprimed set of capacitors 12 is shown as being connected directly to ground, whereas the primed set of capacitors 13 is shown as being connected to the common input 15 of a summing device 16. The delay line 10 will remain sufficiently undisturbed if the common point 15 is maintained as a "virtual ground" (i.e., the input of the summing device 16 possesses an impedance which is much less than the characteristic impedance of the delay line 10). If this is the case, then the value of each of the capacitors 13 of the primed set can vary anywhere from zero to C, the full shunt capacitance of the transmission line at that junction point 14. If the summing device 16 is an integrator, such as the operational integrator shown schematically within the box 16 then the voltage signal at the output 17 of the summing device 16 will be the impulse response 23 when a (negative going) impulse 21 is launched into the input 18 of the transmission line 10. If the feedback element 19 within the summing device 16 is a resistor, then the output at 17 would be the derivative of the impulse response 23. The summing device 16 may include amplifiers, logic elements or any combination of signal processing elements required for the intended use. The unprimed set of capacitors 12 can, of course, be connected in common to a second summing device to provide a second filter characteristic complementary to the filter characteristic at the output port 17. In addition, further capacitor subsets can be split off, so long as the total capacitance connected to each junction point 14 remains C.

Figure 3:
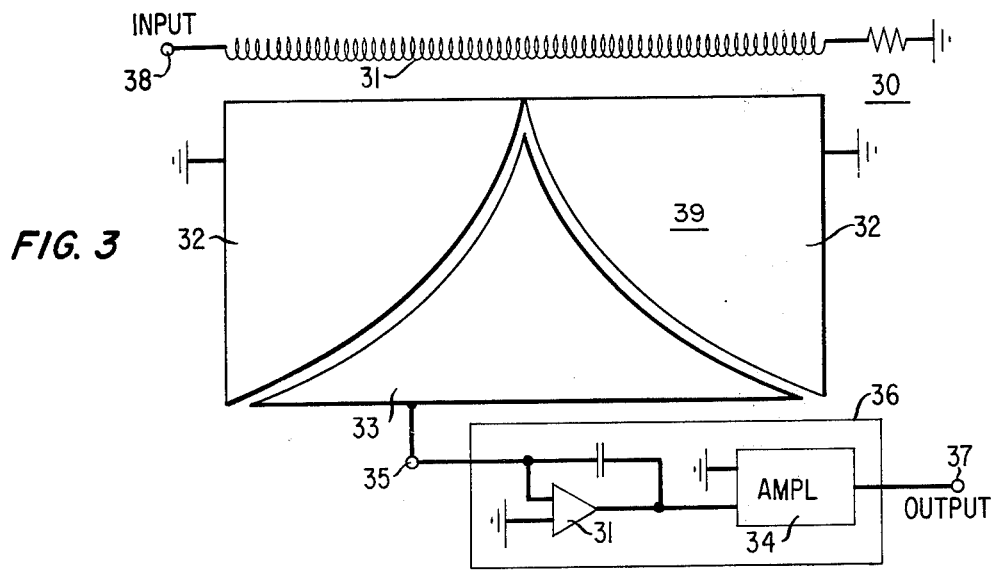
FIG. 3 is a schematic view of an exemplary signal processor of the invention including a length of continuous transmission line with a split ground plane.

FIG. 3 shows, in schematic form, a signal processor of the herein disclosed class incorporating a length of continuous delay line 30. The delay line has an inductance per unit length L and at a total shunt capacitance per unit length C between the center conductor 31 and the ground plane 39. The ground plane 39 is separated into grounded portions 32 and a signal tap portion 33 which corresponds in function to the primed set of capacitors 13 of FIG. 1. This latter portion 33 of ground plane 39 is connected to the input 35 of the summing device 36. As above, this input 35 must be maintained as a virtual ground in order that the transmission line remain sufficiently undisturbed. The impulse response of this signal processor can be readily understood. If a voltage impulse is launched into the input 38 of the transmission line 30 the portion of the signal which is capacitively coupled to the tap portion 33 of the ground plane varies directly with the shape of the tap portion 33 and if the summing device is an integrator, then the signal appearing at the output 37 of the summing device 36 responds directly to the shape of the tap portion 33 when a voltage impulse is launched into the input 38 of the transmission line 30. This cusp shape is considered to be the optimum filter shape for signals from a capacitive source, such as a particle detector or a photodiode. Once again, the summing device 36 may contain an operational integrator 31 and/or some other amplifying device 34 which is analogue or digital in operation.

The correspondence between the waveform in the output 37 and the shape of the tap portion 33 is particularly easy to visualize and design if the velocity of propagation of the impulse down the transmission line 30 is small compared to the velocity of light. If such is the case, then there is little distortion of the output waveform caused by the time delay of signal propagation through the tap portion 33. If the propagation velocity in the transmission line 30 is less than one tenth of the velocity of light, such distortion can be neglected for many purposes. Commercial delay lines with helical center conductors 31 are available with propagation velocities between 100 and 1000 times smaller than the velocity of light.

Figure 4:
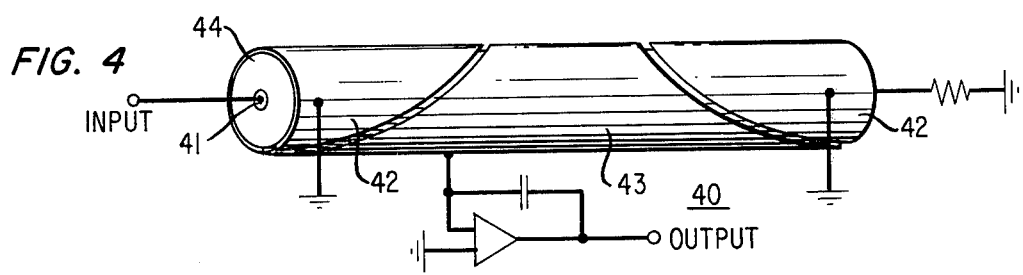
FIG. 4 is a perspective view, partially schematic, of an exemplary filter of the invention incorporating a coaxial transmission line with a split ground plane.

FIG. 4 shows one particularly easily realizable signal processor incorporating a length of coaxial transmission line 40 with its ground plane split into grounded portions 42 and a tap portion 43 generally corresponding to the similar ground plane portions of FIG. 3. If the coaxial transmission line 40 is filled with a polymeric insulator 44 and has a straight center conductor 41, then the propagation velocity is only approximately 40% less than the velocity of light and delay distortion caused by propagation in the tapped portion 43 of the ground plane must be taken into account.

Figure 5:
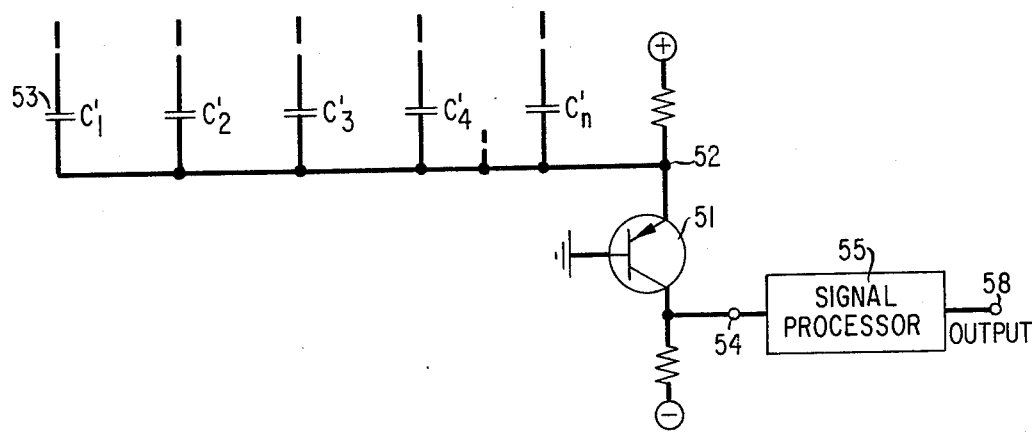
FIG. 5 is a schematic view of a portion of a lumped delay line processor with a grounded base transistor stage as an input to the summing device.

In FIG. 5 a set of primed capacitors 53 (corresponding, for example, to capacitors 13 of FIG. 1) is connected to the emitter of a common base connected transistor amplifier 51 at input point 52. The circuit parameters adjusted such that the input point 52 is a virtual ground as defined above. The output 54 of the transistor amplifier 51 can be used to drive a further signal processing device 55 or the entire assembly from the transmission line input to the output 58 can be incorporated in a single signal processor.

Many signal processor uses, such as those involved in the measurement of the properties of elementary particles, involve the processing of signals derived from a common signal in two or more different filters. In the prior art (e.g. M. Bertolaccini, et al, *International Symposium on Nuclear Electronics* (Versailles, Sept. 1, 1968) Paper No. 65) this has been done by splitting the signal into two portions and passing each portion through the desired filtering network before bringing them back together again. In such a system, it is required that the two branches be kept in time synchronism, which may be difficult to achieve.

Figure 6:
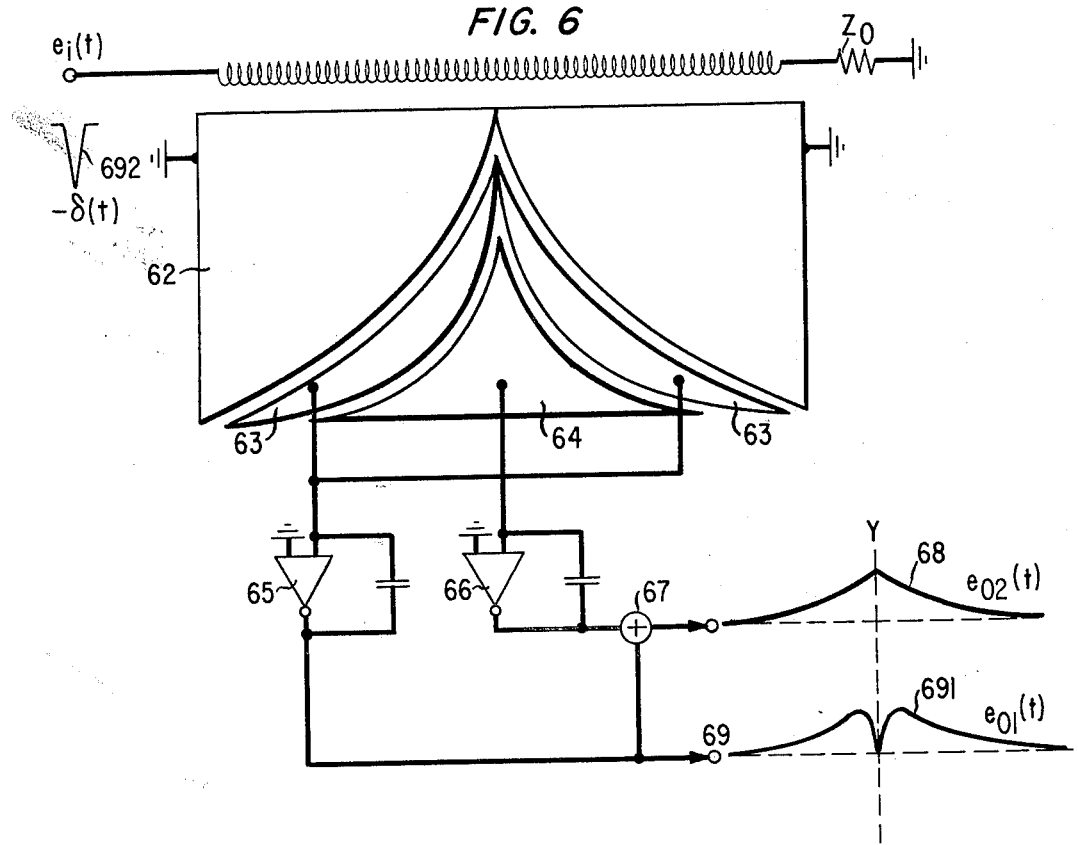
FIG. 6 is a schematic view of a signal processor of the invention incorporating a continuous transmission line with its ground plane split into several portions feeding separate summing devices.

FIG. 6 shows one way of imposing two separate filter responses on a common transmission path. The ground plane is separated into grounded portions 62, first tap portions 63 and a second tap portion 64. The first tap portions 63 are connected to a first operational integrator 65 and the second tap portion 64 is connected to a second operational integrator 66. The output of the two integrators 65, 66 is added 67 to produce the impulse response 68 corresponding to the entire ungrounded portion of the ground plane. The output of the first operational integrator 65 is separately taken out at port 69 and appears as the signal 691 when the transmission line is excited by the impulse 692. This particular combination of filter response is of particular interest in combating the pulse pile up problem encountered in the detection of elementary particle radiation.

Figure 7:
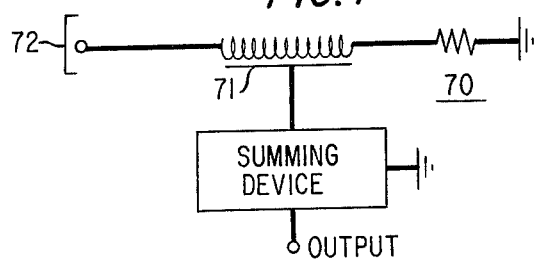
FIG. 7 is a schematic view of a signal processor of the invention incorporating a length of continuous transmission line with its entire ground plane connected to a summing device.

FIG. 7 illustrates the fact that the entire ground plane 71 may be used as the tap portion. In such a case the impulse response of the filter 70 will be a substantially rectangular pulse of length equal to the time delay of the section of transmission line 72.

What is claimed is:

1. A filter comprising a) an electromagnetic transmission line of time delay, T, the transmission line including series inductance and shunt capacitances to ground along its length resulting in a characteristic impedance, (b) sampling means for extracting signal information along at least a portion of the transmission line and (c) summing means for summing the extracted signal information CHARACTERIZED IN THAT the sampling means includes at least one portion of the shunt capacitance at each position along the line at which the signal information is extracted and the summing means includes at least one summing device, which summing device possesses an imput impedance to ground which is small compared to the characteristic impedance of the transmission line, which said portion of the shunt capacitance is chosen such that the transmission characteristic between the input to the transmission line and the output of the summing means possesses the desired frequency response wherein the at least one summing device includes an operational integrator.

2. A filter comprising a) an electromagnetic transmission line of time delay, T, the transmission line including series inductance and shunt capacitances to ground along its length resulting in a characteristic impedance, b) sampling means for extracting signal information along at least a portion of the transmission line and c) summing means for summing the extracted signal information CHARACTERIZED IN THAT the sampling means includes at least one portion of the shunt capacitance at each position along the line at which the signal information is extracted and the summing means includes at least one summing device, which summing device possesses an input impedance to ground which is small compared to the characteristic impedance of the transmission line, which said portion of the shunt capacitance is chosen such that the transmission characteristic between the input to the transmission line and the output of the summing means possesses the desired frequency response wherein the transmission line is lumped delay line which includes a set of inductors of inductance L, serially connected at a set of junction points, and a set of capacitors, consisting of at least a first subset and a second subset, with a first plate of at least one capacitor connected to each junction point and there being no more than one capacitor from each subset connected to each junction point, the total capacitance of all capacitors connected to each junction point being the same value, wherein a second plate of each of the capacitors of at least the first or the second subset of capacitors, chosen from the set of capacitors so as to form the said portion of the shunt capacitance, is connected to the summing device corresponding to that subset of capacitors.

3. A filter of claim 2 in which the said at least one portion of the shunt capacitance includes less than the said shunt capacitance to ground.

4. A filter of claim 2 in which the summing means includes at least two summing devices.

5. A filter comprising a) an electromagnetic transmission line of time delay, T, the transmission line including series inductance and shunt capacitances to ground along its length resulting in a characteristic impedance, b) sampling means for extracting signal information along at least a portion of the transmission line and c) summing means for summing the extracted signal information CHARACTERIZED IN THAT the sampling means includes at least one portion of the shunt capacitance at each position along the line at which the signal information is extracted and the summing means includes at least one summing device, which summing device possesses an input impedance to ground which is small compared to the characteristic impedance of the transmission line, which said portion of the shunt capacitance is chosen such that the transmission characteristic between the input to the transmission line and the output of the summing means possesses the desired frequency response wherein the transmission line is continuous line which includes a center conductor of inductance per unit length, L, and a ground plane, adjacent to the center conductor so as to provide a shunt capacitance per unit length, C, between the center conductor and the ground plane, which ground plane consists of at least one longitudinal portion, at least one of which said longitudinal portions forms the said at least one portion of the shunt capacitance.

6. A filter of claim 5 in which the center conductor is in the shape of a helix such that the propagation velocity of electromagnetic waves in the transmission line is less than one tenth of the speed of light.

7. A filter of claim 5 in which the ground plane consists of at least two longitudinal portions.

8. A filter of claim 5 in which the said at least one portion of the shunt capacitance includes less than the said shunt capacitance to ground.

9. A filter of claim 5 in which the summing means includes at least two summing devices.

10. A signal processing device comprising
   a. an electromagnetic transmission line of time delay, T, the transmission line including series inductance and shunt capacitance to ground along its length resulting in a characteristic impedance,
   b. sampling means for extracting signal information along at least a portion of the transmission line, and
   c. amplifying means for collecting and amplifying the extracted signal information
   CHARACTERIZED IN THAT the sampling means includes at least one portion of the shunt capacitance at each position along the line at which the signal information is extracted and the amplifying means includes at least one amplifier, which amplifier possesses an input impedance to ground which is small compared to the characteristic impedance of the transmission line, which said portion of the shunt capacitance is chosen such that the transmission characteristic between the input to the transmission line and the output of the amplifier possesses the desired frequency response.

11. A device of claim 10 in which the at least one amplifier includes an operational integrator stage at its input.

* * * * *

UNITED STATES PATENT AND TRADEMARK OFFICE
CERTIFICATE OF CORRECTION

PATENT NO. : 4,003,008
DATED : January 11, 1977
INVENTOR(S) : Gabriel L. Miller

It is certified that error appears in the above-identified patent and that said Letters Patent are hereby corrected as shown below:

Column 2, line 61, "Z = L/C" should be --$Z = \sqrt{L/C}$--

Column 5, line 3, "imput" should read --input--.

Signed and Sealed this

Fifteenth Day of March 1977

[SEAL]

Attest:

RUTH C. MASON
*Attesting Officer*

C. MARSHALL DANN
*Commissioner of Patents and Trademarks*